(12) United States Patent
Shi et al.

(10) Patent No.: US 9,866,029 B2
(45) Date of Patent: Jan. 9, 2018

(54) ENHANCING POWER SYSTEM VOLTAGE STABILITY USING GRID ENERGY STORAGE FOR VOLTAGE SUPPORT

(71) Applicant: NEC Laboratories America, Inc., Princeton, NJ (US)

(72) Inventors: Di Shi, San Jose, CA (US); Ratnesh Sharma, Fremont, CA (US)

(73) Assignee: NEC Corporation, Tokyo (JP)

( * ) Notice: Subject to any disclaimer, the term of this patent is extended or adjusted under 35 U.S.C. 154(b) by 203 days.

(21) Appl. No.: 14/932,609

(22) Filed: Nov. 4, 2015

(65) Prior Publication Data

US 2016/0126739 A1 May 5, 2016

Related U.S. Application Data

(60) Provisional application No. 62/074,792, filed on Nov. 4, 2014.

(51) Int. Cl.
*H02J 3/28* (2006.01)
*H02J 3/38* (2006.01)
*G01R 31/36* (2006.01)
*H02J 3/32* (2006.01)
*H02J 3/00* (2006.01)

(52) U.S. Cl.
CPC .......... *H02J 3/383* (2013.01); *G01R 31/3651* (2013.01); *H02J 3/28* (2013.01); *H02J 3/32* (2013.01); *H02J 3/382* (2013.01); *H02J 2003/007* (2013.01); *Y02E 10/563* (2013.01); *Y02E 10/566* (2013.01); *Y02E 60/76* (2013.01); *Y02E 70/30* (2013.01); *Y04S 40/22* (2013.01)

(58) Field of Classification Search
CPC .... H02J 3/383; H02J 3/382; H02J 3/32; H02J 2003/007; H02J 3/381; H02J 3/28; G01R 31/3651; G01R 31/3644; G01R 31/3627; G01R 31/3606; Y02E 60/76; Y02E 10/566; Y02E 10/563; Y02E 70/30; Y04S 40/22

See application file for complete search history.

(56) References Cited

U.S. PATENT DOCUMENTS 9,335,747 B2* 5/2016 Steven .............. G06Q 10/00
2012/0010757 A1* 1/2012 Francino ............ G05B 15/02
700/291

OTHER PUBLICATIONS

Alam, et al., "Distributed Energy Storage for Mitigation of Voltage-Rise Impact caused by Rooftop Solar PV", Power and Energy Society General Meeting, 2012 IEEE, Jul. 2012, pp. 1-8.
Liu, et al., "Distribution System Voltage Performance Analysis for High-Penetration Photovoltaics", National Renewable Energy Laboratory, NREL Technical Monitor, Feb. 2008, pp. 1-46.

* cited by examiner

Primary Examiner — Jung Kim
(74) Attorney, Agent, or Firm — Joseph Kolodka

(57) ABSTRACT

Systems and methods for voltage control in an energy distribution system (EDS), including measuring voltage and current at a node in the EDS where a Grid Energy Storage (GES) device is located. A simplified equivalent of the EDS is generated by identifying parameters for the equivalent and calculating phasors corresponding to the measured voltage and current. At least one of a voltage stability index or a voltage sensitivity factor of the EDS is calculated using the equivalent, and at least one of charging or discharging of the EDS is adjusted based on at least one of the voltage stability index or the voltage sensitivity factor to regulate and stabilize voltage of the EDS.

18 Claims, 8 Drawing Sheets

ENHANCING POWER SYSTEM VOLTAGE STABILITY USING GRID ENERGY STORAGE FOR VOLTAGE SUPPORT

RELATED APPLICATION INFORMATION

This application claims priority to provisional application No. 62/074,792 filed Nov. 4, 2014, the contents of which are incorporated herein by reference.

BACKGROUND OF THE INVENTION

Technical Field

The present invention relates generally to voltage regulation using Grid Energy Storage (GES), and more particularly, to a system and method for regulating voltage using GES to provide voltage support and to enhance power system voltage stability.

Description of the Related Art

Grid-connected energy storage systems (ESSs) are a fast growing global market. Recently, increases in the penetration of renewable energy resources into grid-connected ESSs have presented a challenge to the traditional design and operation of electric power systems. The existing power grid was designed for centralized power generation with unidirectional power flow. With renewable energy (or any other type of distributed generation of electricity), power is effectively generated everywhere and flows in multiple directions. However, the intermittent and highly variable nature of distributed generation causes power quality and/or reliability issues, which leads to increased energy costs. Furthermore, a critical problem is a wide variation of system voltage. For example, as the load continues to increase, utilities attempt to push the grid to transfer more and more power.

In conventional systems, power flows in a single direction from substation to the remote end, and the voltage level drops along the distribution feeder. However, with high penetrations of PV generation, power flow and voltage profiles in a distribution system change significantly over time. When PV generation substantially exceeds local load at the point of common coupling (PCC), surplus power from the PV will flow back to the grid and produce reverse power flows, which causes a voltage rise problem. Furthermore, because of the high variability of solar energy availability (e.g., cloud transient effect), PV generation may fluctuate at a very high ramping rate, which may cause severe power quality and voltage stability issues.

Conventionally, load tap changers (LTCs) are employed to regulate voltages in distribution systems. However, LTCs have a typical delay time of at least 30 seconds, which cannot solve a voltage fast fluctuation problem caused by, for example, PV arrays. Several methods have been attempted to tackle the voltage fluctuation and voltage instability issues, (e.g., curtailing power output from renewable power plants when grid voltage exceeds limits, performing reactive power compensation to elevate or lower voltage, performing active network management, and under voltage load shedding (UVLS) methods). However, no conventional systems or methods effectively and economically regulate and/or stabilize voltage in the power grid.

SUMMARY

A method for voltage control in an energy distribution system (EDS), including measuring voltage and current at a node in the EDS where a Grid Energy Storage (GES) device is located. A simplified equivalent of the EDS is generated by identifying parameters for the equivalent and calculating phasors corresponding to the measured voltage and current. At least one of a voltage stability index or a voltage sensitivity factor of the EDS is calculated using the equivalent, and at least one of charging or discharging of the EDS is adjusted based on at least one of the voltage stability index or the voltage sensitivity factor to regulate and stabilize voltage of the EDS.

A system for voltage control in an energy distribution system (EDS), including a measurement device for measuring voltage and current at a node in the EDS where a Grid Energy Storage (GES) device is located. A simplified equivalent of the EDS is generated, using a processor, by identifying parameters for the equivalent and calculating phasors corresponding to the measured voltage or current, and at least one of a voltage stability index or a voltage sensitivity factor of the EDS is calculated using the equivalent. A controller adjusts at least one of charging or discharging of the EDS based on at least one of the voltage stability index or the voltage sensitivity factor to regulate and stabilize voltage of the EDS.

A computer-readable storage medium including a computer-readable program, wherein the computer-readable program when executed on a computer causes the computer to perform the steps of measuring voltage and current at a node in an Energy Distribution System (EDS) where a Grid Energy Storage (GES) device is located. A simplified equivalent of the EDS is generated by identifying parameters for the equivalent and calculating phasors corresponding to the measured voltage and current. At least one of a voltage stability index or a voltage sensitivity factor of the EDS is calculated using the equivalent, and at least one of charging or discharging of the EDS is adjusted based on at least one of the voltage stability index or the voltage sensitivity factor to regulate and stabilize voltage of the EDS.

These and other advantages of the invention will be apparent to those of ordinary skill in the art by reference to the following detailed description and the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
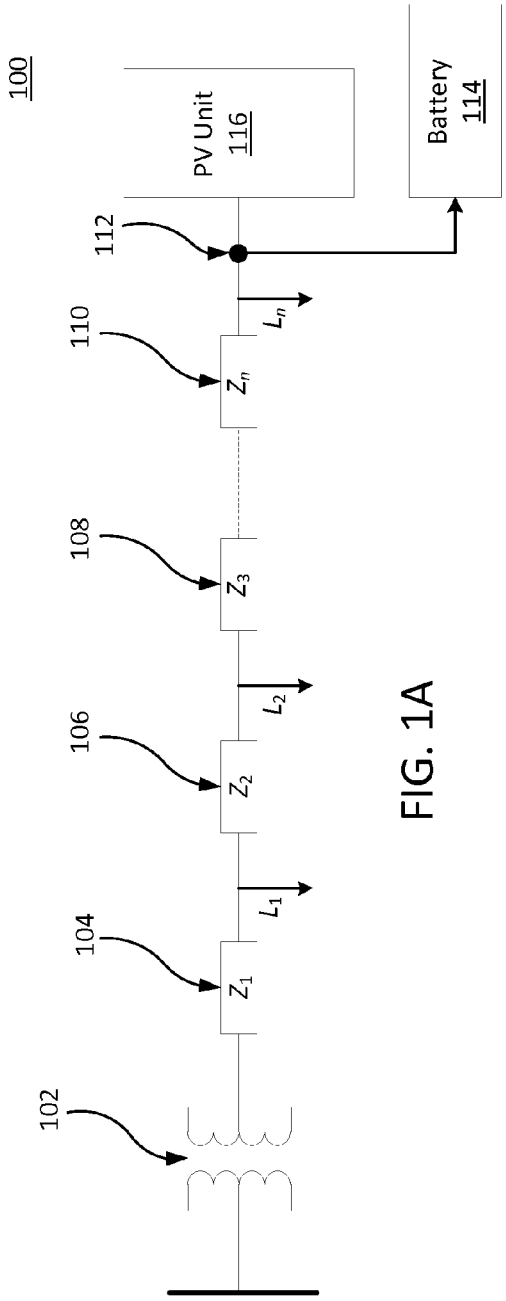
FIG. 1A shows an exemplary power distribution system including a photovoltaic (PV) unit and an Energy Storage System (ESS) integrated at a point of common coupling (PCC) for voltage regulation, in accordance with an embodiment of the present principles.

The present principles are directed to systems and methods for voltage regulation/stabilization using a measurement-based adaptive controller. In a particularly useful embodiment, a measurement-based adaptive controller for grid-scale energy storage (GES) may be employed to regulate and/or stabilize voltage in the power grid. In some embodiments, an energy storage system (ESS) may be integrated with, for example, a photovoltaic (PV) array.

In one embodiment, a real-time system modeling method may be employed to model a power system as a Thevenin equivalent, and a Kalman filter/recursive least squares method may be employed to identify its parameters according to the present principles. Based on the equivalent model, the maximum power that may be transferred by a particular system (or systems) may be measured/tracked, a voltage stability index may be determined/tracked, and a voltage sensitivity factor may be calculated. Based on the calculated index/sensitivity factor, GES may be dispatched to provide voltage support to the grid and to prevent voltage instability according to the present principles.

In one embodiment, the controller may be based on local measurements only, and as such, does not require any communication infrastructure. The control method is highly reliable, as no offline study and no manual operation is necessary. In some embodiments, in addition to greatly reducing costs for electricity suppliers (and customers) and stabilizing voltage, the following advantages may be achieved by employing the present principles: (1) a reduced need/cost for system maintenance, (2) a reduced likelihood of equipment failure, and (3) a reduced need for power curtailment and/or load shedding.

It should be understood that embodiments described herein may be entirely hardware or may include both hardware and software elements, which includes but is not limited to firmware, resident software, microcode, etc. In a preferred embodiment, the present invention is implemented in hardware. The present invention may be a system, a method, and/or a computer program product. The computer program product may include a computer readable storage medium (or media) having computer readable program instructions thereon for causing a processor to carry out aspects of the present invention.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now to the drawings in which like numerals represent the same or similar elements and initially to FIG. 1A, an exemplary power distribution system 100 including a photovoltaic (PV) unit 116 and an Energy Storage System (ESS) 114 (e.g., battery) integrated at a point of common coupling 112 (PCC) for voltage regulation is illustratively depicted in accordance with an embodiment of the present principles. In an illustrative embodiment, the distribution system may include multiple loads (e.g., $L_1, L_2, \ldots L_n$) and a single photovoltaic (PV) unit. This distribution system configuration is presented for simplicity of illustration, but it is noted that the system for voltage regulation/stabilization according to the present principles may be employed for any type of energy distribution system/network according to various embodiments.

In one embodiment, the distribution system 100 may include a transformer 102, impedance is represented by $Z_i$ (i=1, 2, 3, . . . , n) in blocks 104, 106, 108, and 110, and the load for each fragment of a distribution feeder is represented by $L_i$ (i=1, 2, . . . n). A PV array 116 may be installed at the nth fragment of the feeder (e.g., feeder line in the distribution system for carrying power from a substation to customers). For simplicity of illustration, PV and ESS may be assumed to work at a unity power factor with no reactive power generation/consumption in the energy distribution system 100.

In one embodiment, if the PV unit 116 is not installed, voltage may drop along the main feeder line because of, for example, the load (e.g., $L_1, L_2, \ldots L_n$) and feeder impedance 104, 106, 108, and 110, and the farther the distance is from a substation, the lower the voltage. When PV generation is close to its local load $L_n$, a voltage profile along the feeder may be improved since less current may pass through the feeder impedance 104, 106, 108, and 110 than if there were no PV unit installed. When PV generation is greater than a local load, the surplus power may flow back to a substation through the feeder. Because a high R/X ratio may be present in the distribution system 100, the voltage at a PV output terminal may be driven up. When PV generation substantially exceeds the local load, voltages at the PV 116 and adjacent nodes (not shown) may further increase, and may violate voltage limits in some embodiments.

In energy distribution systems 100, voltages at PVs 116 and adjacent nodes may be highly dependent on the output of the PV generation and the loading level. Because of the intermittent nature of solar energy, the PV output may vary significantly in a very short period (e.g., milliseconds, seconds, minutes, etc.). Therefore, the voltage at a PV unit 116 and any adjacent buses may be subject to fast fluctuation, which lowers the power quality and/or damage power equipment.

Figure 1B:
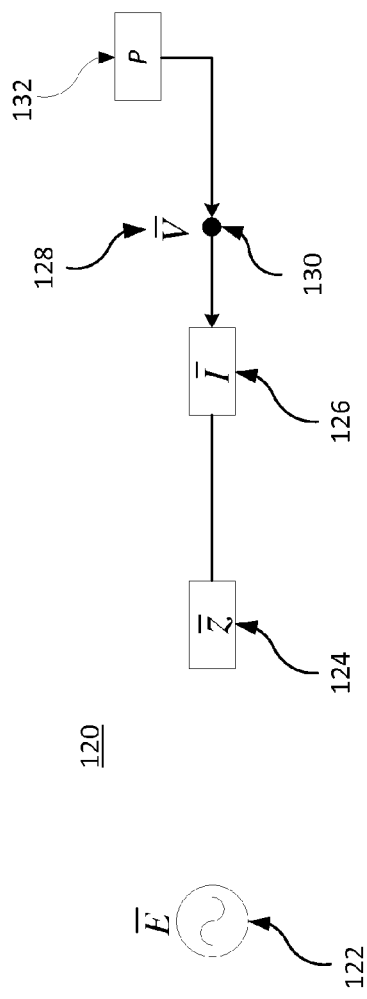
FIG. 1B shows an exemplary power distribution system including a photovoltaic (PV) unit and an Energy Storage System (ESS) integrated at a point of common coupling (PCC) for voltage regulation represented as a Thevenin equivalent, in accordance with an embodiment of the present principles.

Referring now to FIG. 1B, an exemplary power distribution system including a photovoltaic (PV) unit and an Energy Storage System (ESS) integrated at a point of common coupling (PCC) for voltage regulation represented as a Thevenin equivalent 120 is illustratively depicted in accordance with an embodiment of the present principles. In one embodiment, $\bar{E}$ 122 is a complex number representing voltage of the equivalent source, $\bar{Z}$ 124 (complex) is the equivalent impedance; $\bar{V}$ 128 (complex) is the voltage phasor at a point of common coupling 130 (PCC), $\bar{I}$ 126 (complex) and P 132 are current phasor and active power injection from the PV and ESS, respectively. In some embodiments, these variables are constantly changing as system operating conditions vary. The Thevenin equivalent of a power distribution system according to an embodiment of the present principles will be described in further detail herein below with respect to FIG. 4.

Figure 2A:
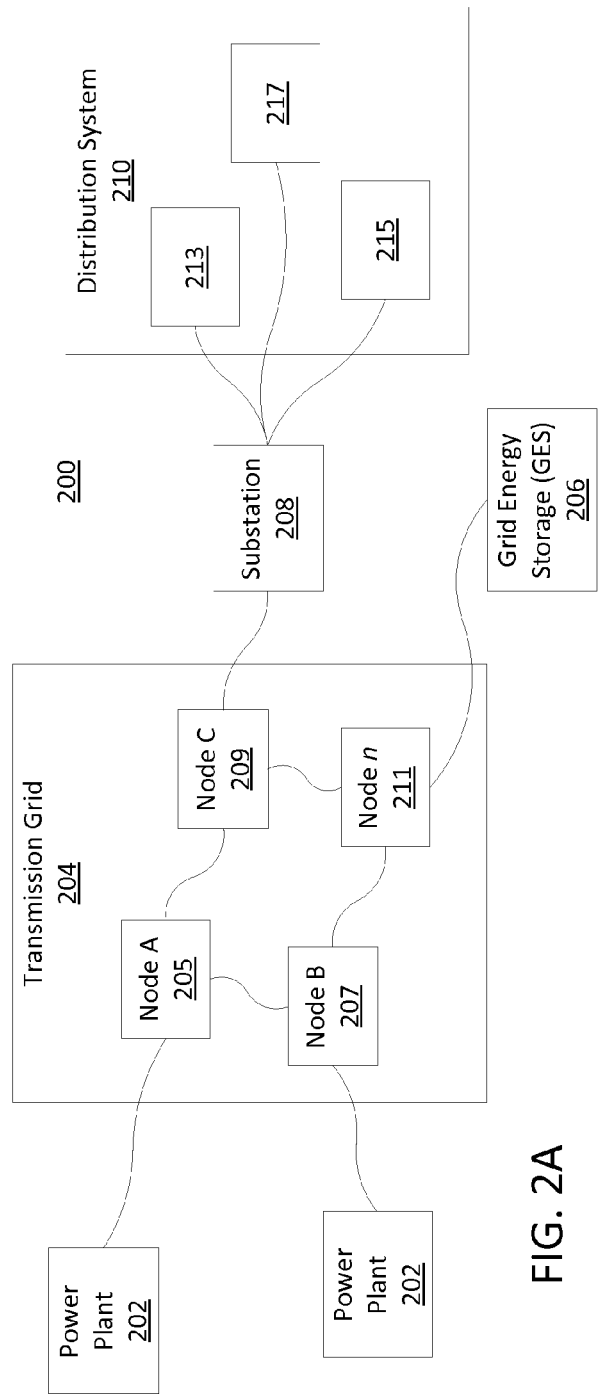
FIG. 2A shows an exemplary power distribution system including grid-scale energy storage (GES), in accordance with an embodiment of the present principles.

Referring now to FIG. 2A, an exemplary power distribution system 200 including grid-scale energy storage (GES) is illustratively depicted in accordance with an embodiment of the present principles. In one embodiment, one or more power plants 202 may transmit energy through a transmission grid 204, and the transmission grid may include a plurality of nodes (e.g., Node A 205, Node B 207, Node C 209, and Node n 211) according to various embodiments. In the present illustration, Node n 211 represents a location where GES 206 is installed. In some embodiments, Node n 211 (or other nodes) may be a substation in a power system 200, or they may be standalone substations 208 according to the present principles.

In one embodiment, a distribution system 210 may receive power/energy through a substation 208, and may distribute the power/energy to various end users/customers 213, 215, and 217. The users/customers may include, for example, residences, office buildings, stores, street lights, etc. according to various embodiments. It is noted that the architecture of the power distribution system in FIG. 2A is presented for simplicity of illustration, and that the present principles may be applied to any size power distribution system with any architecture according to various embodiments.

Figure 2B:
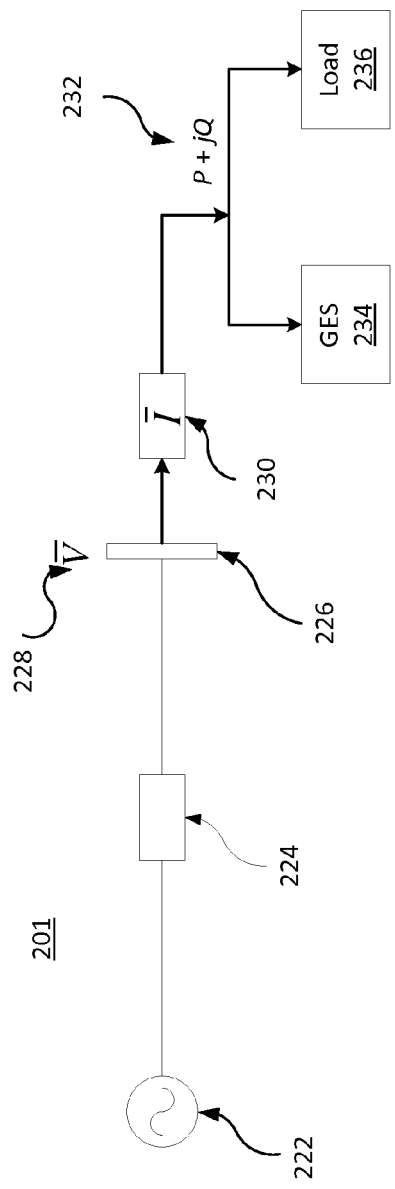
FIG. 2B shows an exemplary power distribution system including grid-scale energy storage (GES) represented as a Thevenin equivalent, in accordance with an embodiment of the present principles.

Referring now to FIG. 2B, an exemplary power distribution system including grid-scale energy storage (GES) represented as a Thevenin equivalent 201 is illustratively depicted in accordance with an embodiment of the present principles. In one embodiment, $\bar{E}_{thev}$222, $\bar{Z}_{thev}$224, $\bar{V}$228, and $\bar{I}$230 may all be complex numbers including real and imaginary parts. The system 201 may include Node n226, and power 232 (e.g., P+jQ) may flow to the GES 234 and the load 236 according to the present principles. The Thevenin equivalent of a power distribution system according to an embodiment of the present principles will be described in further detail herein below with respect to FIG. 4.

Figure 3:
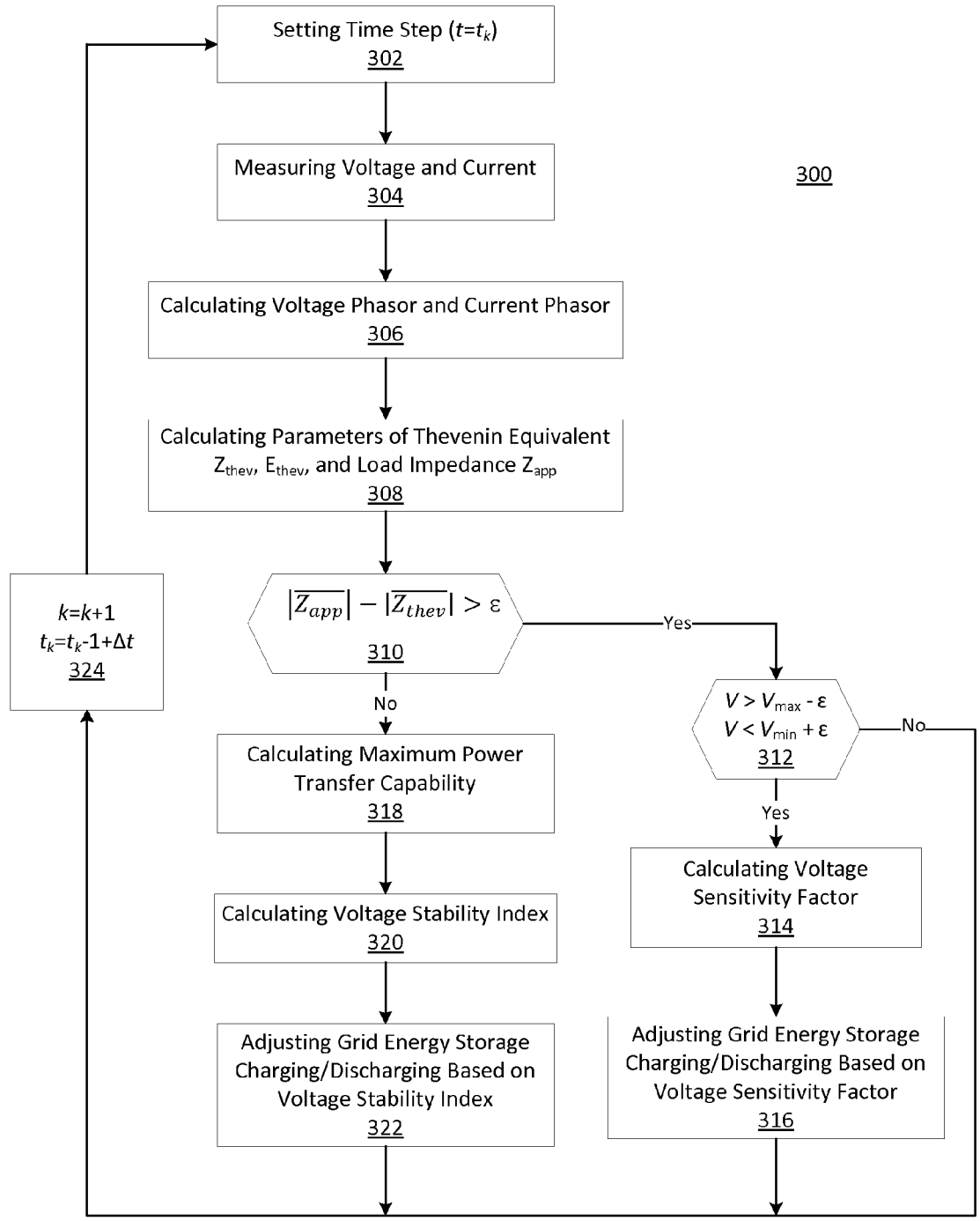
FIG. 3 shows an exemplary method for adjusting grid-scale energy storage (GES) charging/discharging, in accordance with an embodiment of the present principles.

Referring now to FIG. 3, an exemplary method 300 for voltage regulation/stabilization using a measurement-based adaptive control is illustratively depicted in accordance with an embodiment of the present principles. In one embodiment, an initial time step (e.g., $t=t_k$) may be set in block 302. In block 304, voltage and current may be measured, and voltage phasor and current phasor may be calculated in block 306. In block 308, parameters of a Thevenin Equivalent (e.g., $E_{thev}$, $E_{thev}$) and Load impedance (e.g., $Z_{app}$) may be calculated.

In one embodiment, it is determined whether $||\overline{Z_{app}}|-|\overline{Z_{thev}}||>|\epsilon|$ in block 310, where $Z_{app}$ is the apparent impedance, (e.g., calculated based on the voltage and current measurements collected at bus 226), $Z_{thev}$ is the Thevenin equivalent impedance of the line, (e.g., element 224 in FIG. 2B), and $\epsilon$ is a pre-defined small constant. If yes, it is determined whether $V>V_{max}-\epsilon$ and whether $V<V_{min}+\epsilon$ in block 312. If no, maximum power transfer capability may be calculated in block 318, a voltage stability index may be calculated in block 320, and grid energy storage charging/discharging may be adjusted (e.g., using a charging/discharging controller) based on the voltage stability index calculated in block 320. A next time step (e.g., $t_k=t_{k-1}+\Delta t$, k=k+1) may be determined in block 324, a new time step may be set in block 302, and the method may iteratively repeat to continually monitor and adjust grid energy storage charging/discharging to control distribution of power and/or regulate and stabilize voltage in a power distribution system according to the present principles.

In one embodiment, if the result of the determination in block 312 with respect to whether $V>V_{max}-\epsilon$ and whether $V<V_{min}+\epsilon$ is yes, a voltage sensitivity factor may be calculated in block 314, and grid energy storage charging/discharging may be adjusted (e.g., using a charging/discharging controller) in block 316 based on the voltage sensitivity factor calculated in block 314. A next time step (e.g., $t_k=t_{k-1}+\Delta t$, k=k+1) may be determined in block 324, a new time step may be set in block 302, and the method may iteratively repeat to continually monitor and adjust grid energy storage charging/discharging to control distribution of power and/or regulate and stabilize voltage in a power distribution system according to the present principles.

Figure 4:
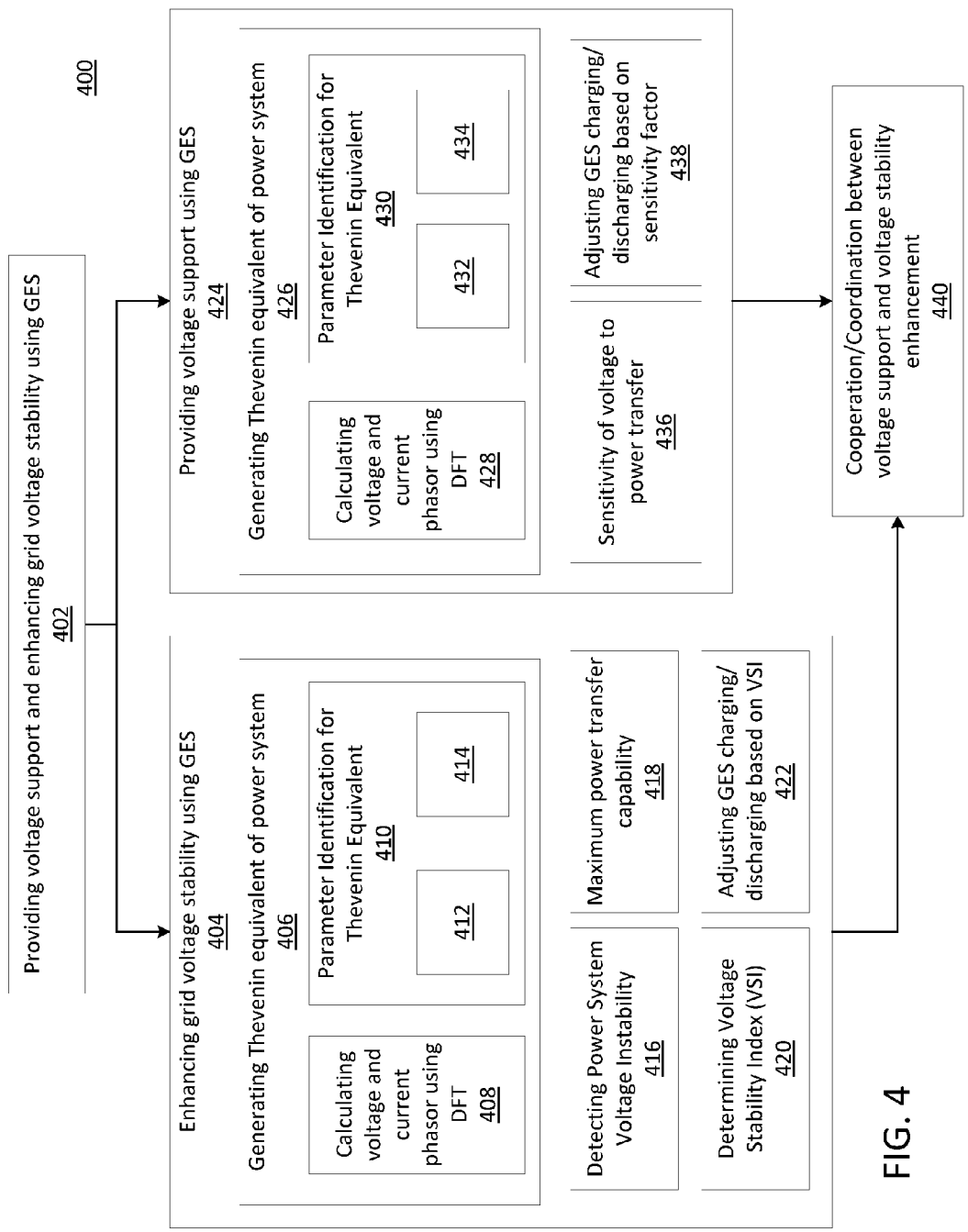
FIG. 4 shows an exemplary method for providing voltage support and enhancing grid voltage stability using grid-scale energy storage (GES), in accordance with an embodiment of the present principles.

Referring now to FIG. 4, with continued reference to FIGS. 2A and 2B, an exemplary method 400 for providing voltage support and enhancing grid voltage stability using grid-scale energy storage (GES) is illustratively depicted in accordance with an embodiment of the present principles. In one embodiment, the method for providing voltage support and enhancing grid voltage stability using grid energy storage (GES) may begin in block 402, and may include enhancing grid voltage stability using GES in block 404 and providing voltage support using GES in block 424 according to the present principles.

As power systems are pushed to transfer more and more power, voltage stability has become a major concern in system planning and operation. Increase in load stresses the system by increasing power transfer over long distances or by consuming reactive power reserves. When load is high enough, actions may be taken to relieve the transmission system to avoid voltage collapse. For example, one action conventionally taken is the under voltage load shedding schemes based on voltage level when system is close to voltage collapse. In one embodiment, the present principles may be employed to adaptively control GES to enhance the voltage stability of power system by avoiding load shedding and/or helping minimize the load to be shed.

In one embodiment, the enhancing grid voltage stability in block 404 and the providing of voltage support using GES in block 424 may include generating a Thevenin equivalent of a power system in blocks 406 and 426, respectively. In one embodiment, in the Thevenin equivalent shown above with respect to FIG. 2B, $\overline{E_{thev}}$, $\overline{Z_{thev}}$, $\overline{V}$, and $\overline{I}$ are all complex numbers comprising of real and imaginary parts. Variable $\overline{E_{thev}}$ represents the voltage of the equivalent source; $\overline{Z_{thev}}$ is the equivalent impedance; $\overline{V}$, and $\overline{I}$ are the voltage and current phasors measured at bus A. The following definitions/relationships are noted:

$$\overline{E_{thev}} = E_{thev} \angle \delta = E_R + j \cdot E_I \qquad (1)$$

$$\overline{Z_{thev}} = R + j \cdot X \qquad (2)$$

$$\overline{V} = V \angle \theta_V = V_R + j \cdot V_I \qquad (3)$$

$$\overline{I} = I \angle \theta_I = I_R + j \cdot I_I \qquad (4)$$

$$P + jQ = \overline{V} \cdot \overline{I}^* \qquad (5)$$

$$\overline{Z_{app}} = \frac{\overline{V}}{\overline{I}} \qquad (6)$$

where $j = \sqrt{-1}$, $\overline{I}^*$ is the conjugate of $\overline{I}$.

In one embodiment, the above variables may be constantly changing as system operating conditions change. Based on the equivalent circuit shown above with reference to FIG. 2B, the following relationship is noted:

$$\overline{E_{thev}} = \overline{V} + \overline{Z_{thev}} \cdot \overline{I} \qquad (7)$$

Equation (7) can be broken up into two real equations, which, in matrix format may be represented as:

$$\begin{bmatrix} V_R \\ V_I \end{bmatrix} = \begin{bmatrix} 1 & 0 & -I_R & I_I \\ 0 & 1 & -I_I & -I_R \end{bmatrix} \cdot \begin{bmatrix} E_R \\ E_I \\ R \\ X \end{bmatrix} \qquad (8)$$

and the Thevenin equivalent may be generated using the above equations in blocks 406 and 426 according to various embodiments of the present principles.

In one embodiment, the generation of Thevenin equivalents in blocks 406 and 426 may include calculating voltage and current phasor in blocks 408 and 428. Voltage and current measurements at bus/node A 226 may be processed using, for example, Discrete Fourier Transform (DFT) to determine the corresponding phasors in blocks 408 and 428. The DFT may transform a sequence of N real numbers (e.g., $x_0, x_1, \ldots x_{N-1}$) into an N-periodic sequence of complex numbers (e.g, $X_1, X_2, \ldots, X_N$). Using DFT, the voltage and current phasors may be calculated in blocks 408 and 428 using the following equations:

$$V_k = \sum_{n=k-N+1}^{k} v_n \cdot e^{-j2\pi kn/N} \qquad (9)$$

$$I_k = \sum_{n=k-N+1}^{k} i_n \cdot e^{-j2\pi kn/N} \qquad (10)$$

where $v_n$ and $i_n$ are the real-time voltage and current measurements at bus A, and $V_k$ and $I_k$ are the corresponding phasors at time step $t_k$, respectively.

In one embodiment, the generation of Thevenin equivalents in blocks 406 and 426 may include parameter identification for one or more Thevenin equivalents in blocks 410 and 430. Parameters of the Thevenin equivalent may be constantly changing as system operating conditions vary. In some embodiments, the parameter identification performed in blocks 410 and 430 may determine and/or identify these parameters in real time using, for example, a Kalman filter in blocks 412 and 432, and/or a recursive least squares (RLS) method in blocks 414 and 434 according to the present principles.

In one embodiment, the Kalman filter in blocks 412 and 432 may be an optimal state estimator for dynamical systems. It may estimate the system unknown states efficiently in a recursive way. A general discrete state-space representation of a dynamic system according to the present principles may be represented as follows:

$$x_{k+1} = A_k x_k + w_k \qquad (11)$$

$$z_k = H_k x_k + v_k \qquad (11)$$

where $x_k$ is the state vector, $A_k$ is the state transition matrix, $z_k$ is the measurement vector, $H_k$ is the observation matrix, and $w_k$ and $v_k$ are the process noise and measurement noise, respectively. Noise $w_k$ and $v_k$ may be assumed to be independent of each other, and their covariance matrixes may be given by equations (12)-(13) as follows:

$$E(w_k w_k^T) = W_k \qquad (12)$$

$$E(v_k v_k^T) = V_k \qquad (13)$$

In one embodiment, a sliding window including four measurement points may be employed for parameter estimation in blocks 412 and 432. In particular, the vectors/matrixes used in parameter identification may be defined by equations (14)-(17) as follows:

$$x_k = \begin{bmatrix} E_R^k \\ E_I^k \\ R^k \\ X^k \end{bmatrix}_{4 \times 1} \qquad (14)$$

$$z_k = \begin{bmatrix} V_R^{k1} \\ V_I^{k1} \\ \vdots \\ V_R^{k4} \\ V_I^{k4} \end{bmatrix}_{8 \times 1} \qquad (15)$$

$$A_k = \begin{bmatrix} 1 & & & \\ & 1 & & \\ & & 1 & \\ & & & 1 \end{bmatrix}_{4 \times 4} \qquad (16)$$

-continued $$H_k = \begin{bmatrix} 1 & 0 & -I_R^{k1} & I_I^{k1} \\ 0 & 1 & -I_I^{k1} & -I_R^{k1} \\ \vdots & \vdots & \vdots & \vdots \\ 1 & 0 & -I_R^{k4} & I_I^{k4} \\ 0 & 1 & -I_I^{k4} & -I_R^{k4} \end{bmatrix}_{8 \times 4} \quad (17)$$

where $(.)^k$ refers to the unknown parameters at the kth time step (window), and $(.)^{ki}$ refers to the ith measurement point at the kth time step (window).

In one embodiment, the unknown parameters at each time instant may be calculated by recursively applying the following set of update equations (18)-(21):

$$P_{k+1} = A_{k+1} P_k A_{k+1}^T + V_k \quad (18)$$

$$K_{k+1} = P_{k+1} H_{k+1}^T [H_{k+1} P_{k+1} H_{k+1}^T + W_{k+1}]^{-1} \quad (19)$$

$$x_{k+1} = A_{k+1} x_k + K_{k+1} [z_{k+1} - H_{k+1} A_k x_k] \quad (20)$$

$$P_{k+1} = P_{k+1} - K_{k+1} H_{k+1} P_{k+1} \quad (21)$$

where $K_k$ is the Kalman gain at time step k.

In one embodiment, parameters of the Thevenin equivalent may be identified using a recursive least squares method in blocks 414 and 434. A basic measurement model for the Thevenin equation may be represented as follows:

$$z_k = H_k x_k + v_k \quad (22)$$

where $x_k$ is the unknown vectors $$x_k = \begin{bmatrix} E_R^k \\ E_I^k \\ R^k \\ X^k \end{bmatrix}_{4 \times 1},$$

$H_k$ is the observation matrix, and $v_k$ is the measurement noise. Using a sliding window including, for example, 4 data samples, the recursive equations used at each time step for parameter identification may be represented as follows:

$$x_k = (H_k^T H_k)^{-1} H^T z_k \quad (23)$$

where $$H_k = \begin{bmatrix} 1 & 0 & -I_R^{k1} & I_I^{k1} \\ 0 & 1 & -I_I^{k1} & -I_R^{k1} \\ \vdots & \vdots & \vdots & \vdots \\ 1 & 0 & -I_R^{k4} & I_I^{k4} \\ 0 & 1 & -I_I^{k4} & -I_R^{k4} \end{bmatrix}_{8 \times 4} \quad (24)$$

$$z_k = \begin{bmatrix} V_R^{k1} \\ V_I^{k1} \\ \vdots \\ V_R^{k4} \\ V_I^{k4} \end{bmatrix}_{8 \times 1} \quad (25)$$

where $(.)^k$ refers to the unknown parameters at the $k^{th}$ time step (window), and $(.)^{ki}$ refers to the $i^{th}$ measurement point at the $k^{th}$ time step (window).

In block 416, power system voltage instability may be detected according to the one embodiment of the present principles. For example, from equations (5) and (7), the following may be determined:

$$\left(\frac{P+jQ}{\overline{V}}\right)^* = \overline{I} = \frac{\overline{E_{thev}} - \overline{V}}{\overline{Z_{thev}}} \quad (26)$$

from which the following may be derived:

$$(P+jQ)^* \cdot \overline{Z_{thev}} = \overline{V}^* \cdot (\overline{E_{thev}} - \overline{V}) \quad (27)$$

In some embodiments, for a given set of P (e.g., active/real power) and Q (e.g., reactive power), equation (27) may include two solutions. From the symmetry structure of the equation, it is clear that if one solution is $\overline{V}$, the other solution can be found as $(\overline{E_{thev}} - \overline{V})^*$. When the two solutions become equal, the maximum transfer capability may be reached, and further increase in the load may lead to voltage instability. Therefore, the condition (e.g., boundary) that the system reaches voltage instability may be represented as follows:

$$\overline{V}^* = (\overline{E_{thev}} - \overline{V}) \quad (28)$$

By combing (6), (7) and (28) according to the present principles, the following may be obtained:

$$(\overline{Z_{app}} \cdot \overline{I})^* = \overline{Z_{thev}} \cdot \overline{I} \quad (29)$$

or $$|\overline{Z_{app}}| = |\overline{Z_{thev}}| \quad (30)$$

Therefore the condition for power system to reach voltage instability, as detected in block 416 may be that the magnitude of the apparent impedance $\overline{Z_{app}}$ is equal to or smaller than that of the Thevenin impedance $\overline{Z_{thev}}$. In some embodiments, by comparing the magnitude of the two impedance (e.g., apparent and Thevenin), the present principles may be employed to determine whether the system is voltage instable or how close the system is to voltage instability in block 416. It is noted that the parameters of the Thevenin equivalent may be constantly changing as system operating conditions change and a boundary condition between voltage stability and instability continues to change.

In one embodiment, maximum power transfer capability (e.g., maximum power that may be transferred through node A) may be calculated in block 418. The following may be defined:

$$\overline{Y_{thev}} = \frac{1}{\overline{Z_{thev}}} = Y_{thev} \angle \beta = G + j \cdot B \quad (31)$$

$$\varphi = \cos^{-1}\left(\frac{P}{\sqrt{P^2 + Q^2}}\right) \quad (32)$$

The power flowing through node A can be calculated as:

$$P + jQ = \overline{V} \cdot \overline{I}^* = \overline{V} \cdot \left(\frac{\overline{E} - \overline{V}}{\overline{Z_{thev}}}\right)^* \quad (33)$$

from which the following may be obtained:

$$P = EVY \cos(\theta_r - \delta - \beta) - V^2 G \quad (34)$$

$$Q = EVY\sin(\theta_Y - \delta - \beta) + V^2 B \quad (35)$$

where $Y_{thev}$ is the admittance, $Z_{thev}$ is the impedance of the Thevenin equivalent line, and G and B are the real part and imaginary part of the admittance, respectively. In some embodiments, $Y_{thev}$ may be the inverse of $Z_{thev}$.

In some embodiments, by combining equations (34) and (35) by removing the trigonometric functions, the following may be obtained:

$$\left(\frac{P}{E^2 Y} + \frac{V^2 G}{E^2 Y}\right)^2 + \left(\frac{Q}{E^2 Y} - \frac{V^2 G}{E^2 Y}\right)^2 = \frac{V^2}{E^2} \quad (36)$$

By solving for P, the following may be determined:

$$P = -\frac{V^2}{E^2}\cos\varphi\cos(\varphi + \beta) + \cos\varphi\sqrt{\frac{V^2}{E^2} - \frac{V^4}{E^4}\sin^2(\varphi + \beta)} \quad (37)$$

where E is the voltage of the Thevenin equivalent source, V is the voltage at the (load) bus, and P and Q are the real and reactive power, respectively, flowing through the (load) bus. To calculate the critical voltage and maximum active power that can be transferred in node A, let derivative $$\frac{\partial P}{\partial E}$$

be zero:

$$\frac{\partial P}{\partial V} = 0 \Leftrightarrow 1 - \frac{4V^2}{E^2} + \frac{4V^4}{E^4} = 0 \quad (38)$$

The maximum power that can be transferred through node A may be determined in block 418 as follows:

$$P_{max} = V^2 Y \cos \varphi \quad (39)$$

$$Q_{max} = V^2 Y \sin \varphi \quad (40)$$

In one embodiment, the voltage stability index (VSI) may be defined as the margin between the maximum power that can be transferred (e.g., as determined by equations 40-41) and the actual power that is being transferred through, for example, Node A in block 418. In block 420, the VSI may be calculated for real power and active power in equations (42)-(43), respectively, as follows:

$$P_{index} = P_{max} - P_{actual} \quad (41)$$

$$Q_{index} = Q_{max} - Q_{actual} \quad (42)$$

It is noted that in some embodiments, the VSIs may not be constant, and may change over time depending on, for example, system operating conditions, including, for example, the opening of a circuit breaker in the network or switching on/off of some load.

In one embodiment, GES charging/discharging may be adjusted based on the VSI in block 422 according to the present principles. Based on the VSI, the closeness of the system to voltage instability may be tracked, and when the VSI is smaller than a pre-determined threshold, the GES may be dispatched to change its charging or discharging depending on its operating condition in block 422 according to various embodiments of the present principles. The GES charging/discharging in block 422 will be described in further detail herein below with reference to FIG. 5.

In power systems, various standards (e.g., 1250-2011-IEEE Guide for Identifying and Improving Voltage Quality in Power Systems) may require that system voltage stay within a particular limit band. In block 424, when the local voltage at, for example, Node A, goes beyond the limits or close to the limits (depending on system settings), GES may be controlled adaptively using, for example, an adaptive voltage controller to provide real and/or reactive power to support the voltage according to the present principles. In block 436, based on the equivalent circuit, the sensitivity of voltage at node A to power transfer S (e.g., equal to P+jQ), may be calculated as follows:

$$\frac{\Delta \overline{V}}{\Delta S} \approx \frac{Z_{thev}}{\overline{V}} \quad (43)$$

resulting in a sensitivity factor as follows:

$$\Delta \overline{V} = \frac{\Delta P + \Delta Q}{\overline{V}} \cdot Z_{thev} \quad (44)$$

In block 438, GES charging/discharging may be adjusted based on a sensitivity factor according to the present principles. For example, in one embodiment, it may be desired that the voltage at node A always stays within particular limits (e.g., between $V_{min}$ and $V_{max}$), which may be represented as follows:

$$|\Delta \overline{V} + \overline{V}| = \left|\overline{V} + \frac{\Delta P + \Delta Q}{\overline{V}} \cdot Z_{thev}\right| > V_{min} + \varepsilon \quad (46)$$

and $$|\Delta \overline{V} + \overline{V}| = \left|\overline{V} + \frac{\Delta P + \Delta Q}{\overline{V}} \cdot Z_{thev}\right| < V_{max} + \varepsilon$$

In one embodiment, preventative control may be applied in block 438 based on the sensitivity factor determined in block 436. For example, when the dispatch for a grid-scale energy storage system (GES) is changed, the present principles may be employed to perform calculations based on equation (46) to ensure that the voltage stays within the limits before a change in charging/discharging command is issued and enforced according to various embodiments. In some embodiments, local voltage at particular nodes (e.g., node A) may violate the limits. In this situation, a voltage controller may be employed according to the present principles to control the GES and bring the voltage back to acceptable levels. This will be described in further detail herein below with reference to FIG. 6.

In block 440, there may be cooperation between the enhancing of grid voltage stability using GES in block 404 and the providing voltage support using GES in block 424 to improve overall system performance, including, for example, resolving power quality, reliability, and/or stability issues. In one embodiment, using GES to enhance grid voltage stability may be given priority over voltage support during cooperation in block 440, and as such, voltage may be stabilized using the present principles before providing voltage support. In this embodiment, once the system has no voltage instability issues, the GES may then be employed to provide voltage support according to the present principles.

Figure 5:
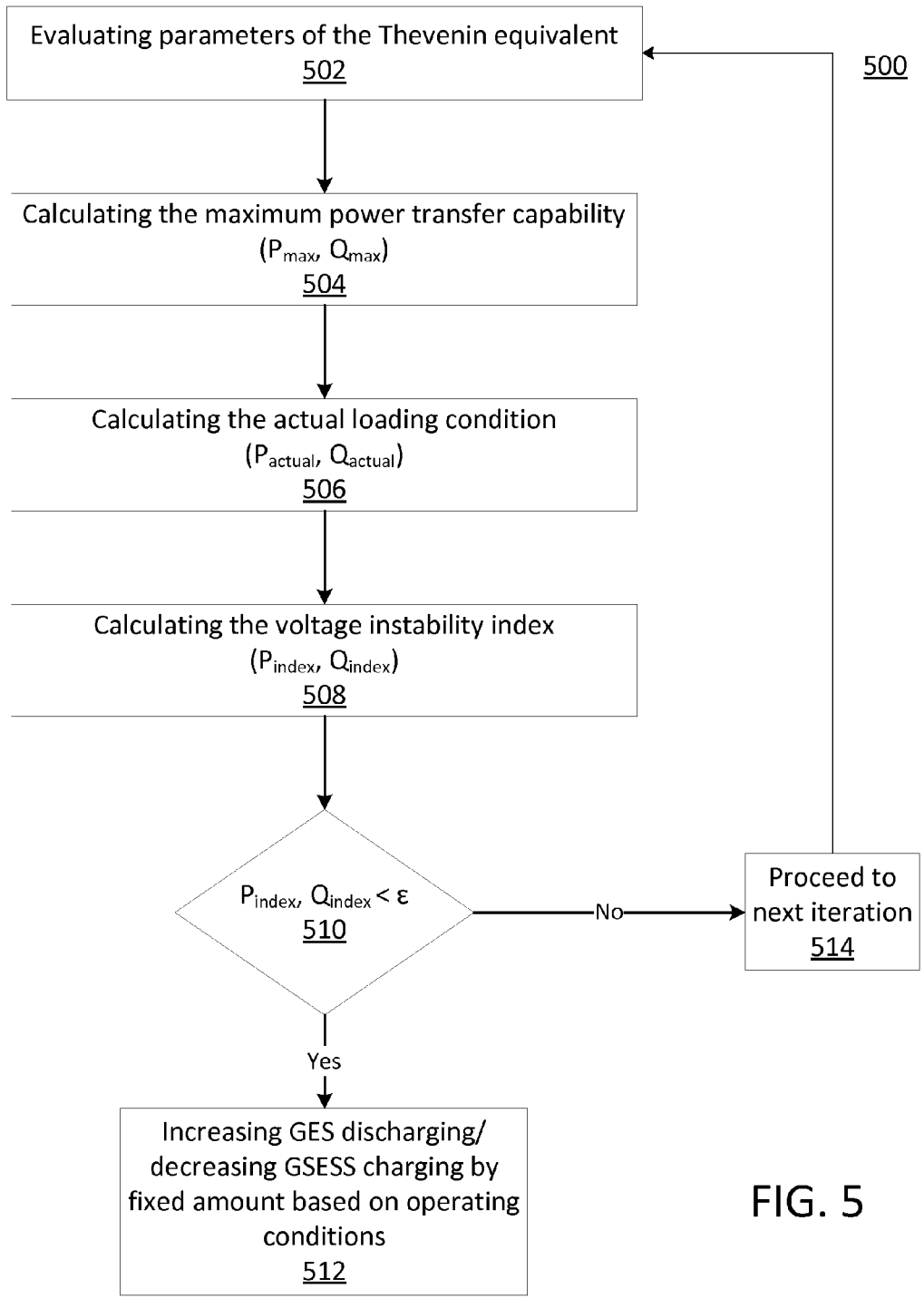
FIG. 5 shows an exemplary method for adjusting grid-scale energy storage (GES) charging/discharging based on a voltage stability index, in accordance with an embodiment of the present principles.

Referring now to FIG. 5, with continued reference to FIG. 4, an exemplary method 500 for adjusting grid-scale energy storage (GES) charging/discharging based on a voltage stability index (e.g., element 422 in FIG. 4) is illustratively depicted in accordance with an embodiment of the present principles. In one embodiment, parameters of the Thevenin equivalent may be evaluated in block 502, and the maximum power transfer capability 504 (e.g., ($P_{max}$, $Q_{max}$)) may be calculated in block 504, as described above with reference to element 418 of FIG. 4. In block 506, an actual loading condition may be calculated (e.g., ($P_{actual}$, $Q_{actual}$)), as described above with reference to equation (34), where P is the real power at a node, and Q is the reactive power at the node. The voltage stability/instability index (e.g., ($P_{index}$, $Q_{index}$)), may be calculated in block 508, as described above with reference to element 420 of FIG. 4.

In block 510, it may be determined whether the voltage stability/instability index ($P_{index}$, $Q_{index}$)<$\epsilon$, where $\epsilon$ is a pre-determined threshold condition. If ($P_{index}$, $Q_{index}$)<$\epsilon$, the GES discharging may be increased and GSESS charging may be decreased by a fixed amount, or may be based on one or more operating conditions according to various embodiments of the present principles. If no, the method may proceed to a next iteration in block 514, and the method 500 may be iteratively performed until ($P_{index}$, $Q_{index}$)<$\epsilon$ according to the present principles.

Figure 6:
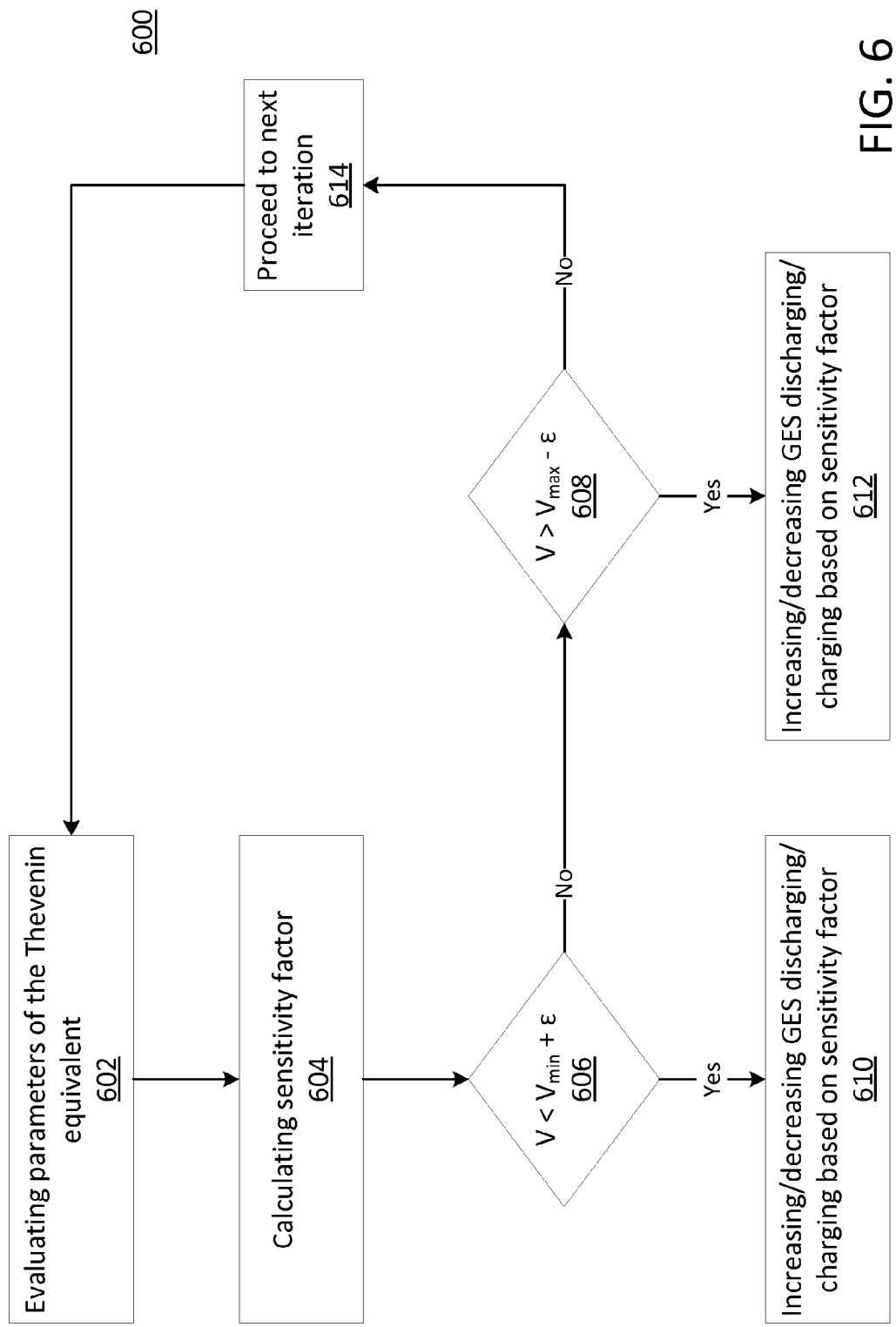
FIG. 6 shows an exemplary method for adjusting grid-scale energy storage (GES) charging/discharging based on a sensitivity factor, in accordance with an embodiment of the present principles.

Referring now to FIG. 6, with continued reference to FIG. 4, an exemplary method 600 for adjusting grid-scale energy storage (GES) charging/discharging based on a sensitivity factor (e.g., element 438 in FIG. 4) is illustratively depicted in accordance with an embodiment of the present principles. In one embodiment, parameters of the Thevenin equivalent may be evaluated in block 602, and a sensitivity factor may be calculated in block 604, as described above with reference to element 436 of FIG. 4.

In block 606, it may be determined whether V<$V_{min}$+$\epsilon$, where V is the voltage at a node, $V_{min}$ is the minimum voltage required based on the standard/requirement, and $\epsilon$ is a pre-defined small constant. If yes, GES discharging/charging may be increased/decreased based on the sensitivity factor (e.g., $P_{index}$ and $Q_{index}$ are the amount of power to be adjusted, as shown in equations (42)-(43)) in block 610 using, for example, a GES charging/discharging controller according to the present principles. If no, it may be determined whether V>$V_{max}$−$\epsilon$, and if yes, GES discharging/charging may be increased/decreased based on the sensitivity factor in block 612 according to the present principles. If no, the method may proceed to a next iteration in block 614, and the method 600 may be iteratively performed beginning in block 602 until the voltage goes back to the required range according to various embodiments of the present principles.

Figure 7:
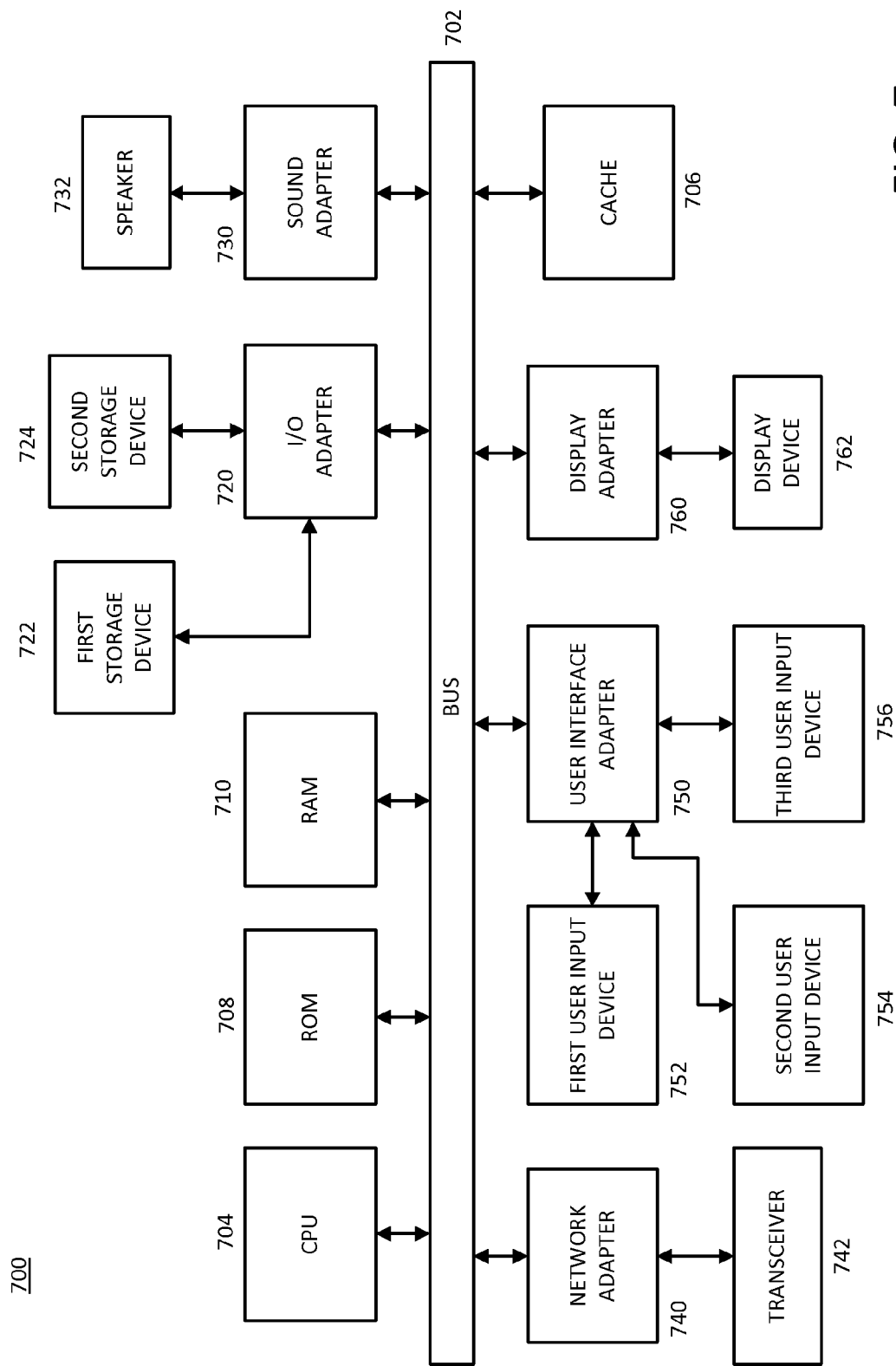
FIG. 7 shows an exemplary processing system to which the present principles may be applied, in accordance with an embodiment of the present principles.

Referring now to FIG. 7, an exemplary processing system 700, to which the present principles may be applied, is illustratively depicted in accordance with an embodiment of the present principles. The processing system 700 includes at least one processor (CPU) 204 operatively coupled to other components via a system bus 702. A cache 706, a Read Only Memory (ROM) 708, a Random Access Memory (RAM) 710, an input/output (I/O) adapter 720, a sound adapter 730, a network adapter 740, a user interface adapter 750, and a display adapter 760, are operatively coupled to the system bus 702.

A first storage device 722 and a second storage device 724 are operatively coupled to system bus 702 by the I/O adapter 720. The storage devices 722 and 724 can be any of a disk storage device (e.g., a magnetic or optical disk storage device), a solid state magnetic device, and so forth. The storage devices 722 and 724 can be the same type of storage device or different types of storage devices.

A speaker 732 is operatively coupled to system bus 702 by the sound adapter 730. A transceiver 742 is operatively coupled to system bus 702 by network adapter 740. A display device 762 is operatively coupled to system bus 702 by display adapter 760.

A first user input device 752, a second user input device 754, and a third user input device 756 are operatively coupled to system bus 702 by user interface adapter 750. The user input devices 752, 754, and 756 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 752, 754, and 756 can be the same type of user input device or different types of user input devices. The user input devices 752, 754, and 756 are used to input and output information to and from system 700.

Of course, the processing system 700 may also include other elements (not shown), as readily contemplated by one of skill in the art, as well as omit certain elements. For example, various other input devices and/or output devices can be included in processing system 700, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 700 are readily contemplated by one of ordinary skill in the art given the teachings of the present principles provided herein.

Figure 8:
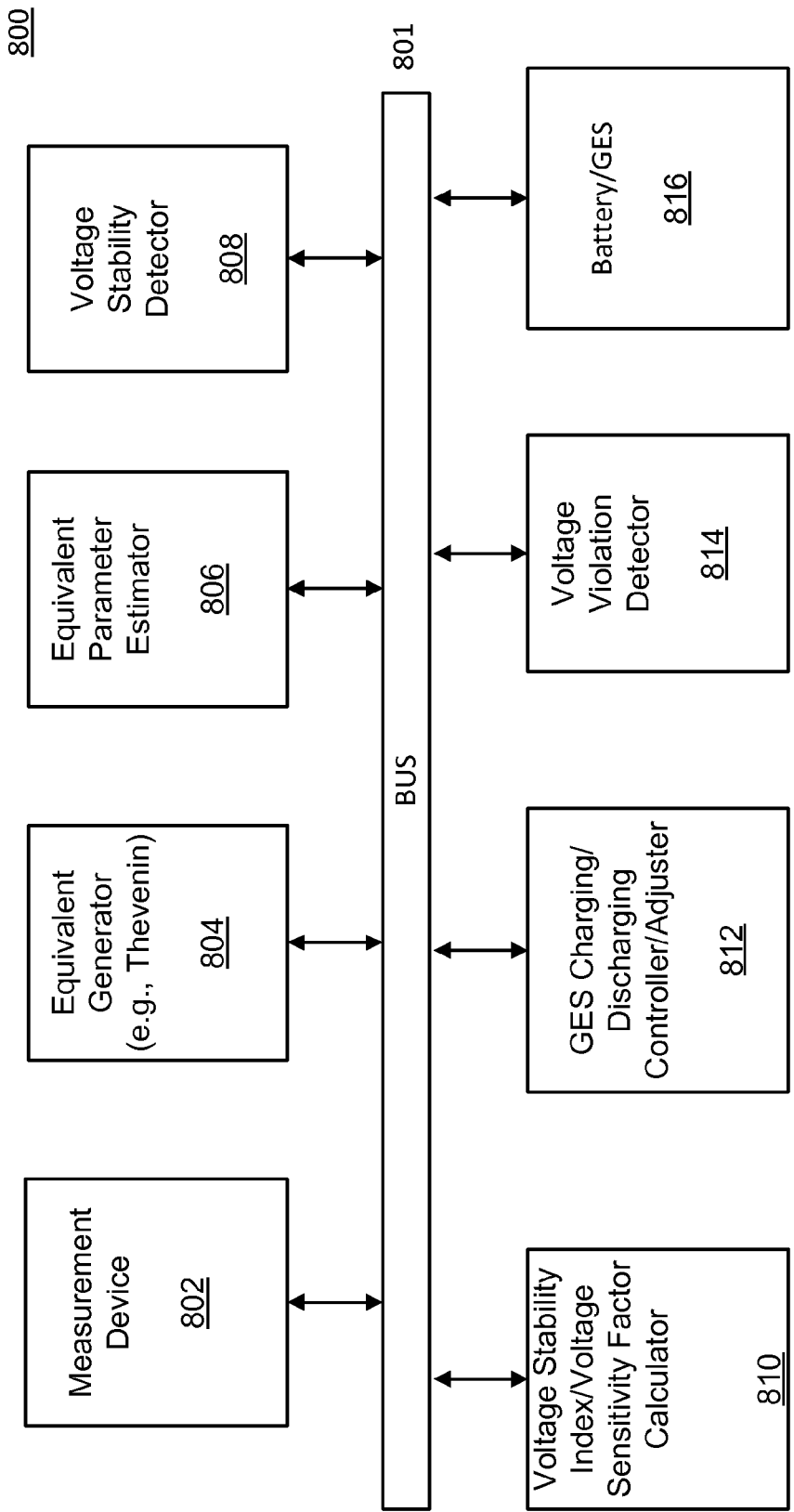
FIG. 8 shows an exemplary system for voltage regulation/stabilization using a measurement-based adaptive controller, in accordance with an embodiment of the present principles.

Moreover, it is to be appreciated that system 800 described below with respect to FIG. 8, is a system for implementing respective embodiments of the present principles. Part or all of processing system 700 may be implemented in one or more of the elements of system 800.

Further, it is to be appreciated that processing system 700 may perform at least part of the method described herein including, for example, at least part of methods 300, 400, 500, and 600 of FIGS. 3, 4, 5, and 6, respectively. Similarly, part or all of system 800 may be used to perform at least part of methods 300, 400, 500, and 600 of FIGS. 3, 4, 5, and 6, respectively.

Referring now to FIG. 8, an exemplary system 800 for voltage regulation/stabilization using a measurement-based adaptive controller is illustratively depicted in accordance with an embodiment of the present principles. While many aspects of system 800 are described in singular form for the sakes of illustration and clarity, the same can be applied to multiples ones of the items mentioned with respect to the description of system 800. For example, while a single controller/adjuster 814 is described, more than one voltage regulator 814 can be used in accordance with the teachings of the present principles, while maintaining the spirit of the present principles. Moreover, it is appreciated that the voltage regulator is but one aspect involved with system 800 than can be extended to plural form while maintaining the spirit of the present principles.

In one embodiment, a measurement device 802 may be employed to measure voltage and/or current at a node where a GES 816 is located. A power system may be simplified using an equivalent generator 804 to generate, for example, a Thevenin equivalent, and the parameters of the equivalent may be estimated/calculated with an equivalent parameter estimator 806.

In one embodiment, a voltage stability/voltage violation detector 808 may determine whether there are any potential (or present) voltage stability issues in the node or system. A voltage stability index/voltage sensitivity factor calculator 810 may calculate a voltage stability index and a GES discharging/charging controller/adjuster 812 may be employed to adjust GES charging/discharging based on the calculated index in accordance with the present principles. A voltage stability/voltage violation detector 808 may determine whether there are any potential (or present) voltage violation issues, and the voltage stability index/voltage sensitivity factor calculator 810 may then calculate a voltage sensitivity factor and a GES discharging/charging controller/adjuster 812 may be employed to adjust GES charging/discharging based on the voltage sensitivity factor in accordance one embodiment of the present principles. In some embodiments, a dedicated voltage regulator 814 may be attached to a node to regulate local system voltage according to the present principles.

In the embodiment shown in FIG. 8, the elements thereof are interconnected by a bus 801. However, in other embodiments, other types of connections can also be used. Moreover, in an embodiment, at least one of the elements of system 800 is processor-based and/or a logic circuit. Further, while one or more elements may be shown as separate elements, in other embodiments, these elements can be combined as one element. The converse is also applicable, where while one or more elements may be part of another element, in other embodiments, the one or more elements may be implemented as standalone elements. These and other variations of the elements of system 800 are readily determined by one of ordinary skill in the art, given the teachings of the present principles provided herein, while maintaining the spirit of the present principles.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

What is claimed is:

1. A method for voltage control in an energy distribution system (EDS), comprising:
    measuring voltage and current at a node in the EDS where a Grid Energy Storage (GES) device is located;
    generating a simplified equivalent of the EDS by identifying parameters for the equivalent and calculating phasors corresponding to the measured voltage and current, the phasors being calculated using Discrete Fourier Transform by transforming a sequence of N real numbers into an N-periodic sequence of complex numbers;
    determining at least one of a voltage stability index or a voltage sensitivity factor of the EDS using the equivalent; and
    adjusting at least one of charging or discharging of the EDS based on at least one of the voltage stability index or the voltage sensitivity factor to regulate and stabilize voltage of the EDS.

2. The method of claim 1, wherein the equivalent is a Thevenin equivalent.

3. The method of claim 1, wherein the voltage stability index is determined after detection of voltage instability in the EDS.

4. The method of claim 1, wherein the voltage sensitivity factor is determined after detection of a voltage violation in the EDS.

5. The method of claim 1, wherein the parameters for the equivalent continually change as EDS operating conditions vary.

6. The method of claim 1, wherein the parameters for the equivalent are identified using a Kalman filter.

7. The method of claim 1, wherein the parameters for the equivalent are identified using recursive least squares.

8. The method of claim 1, wherein the determining of the voltage stability index includes calculating a maximum power transferrable through a particular node.

9. The method of claim 1, wherein the voltage instability is detected when a magnitude of apparent impedance is equal to or smaller than the magnitude of Thevenin impedance.

10. A system for voltage control in an energy distribution system (EDS), comprising:
    a measurement device for measuring voltage and current at a node in the EDS where a Grid Energy Storage (GES) device is located;
    a processor configured to generate a simplified equivalent of the EDS by identifying parameters for the equivalent and calculating phasors corresponding to the measured voltage and current, wherein at least one of a voltage stability index or a voltage sensitivity factor are determined based on the equivalent, the phasors being calculated using Discrete Fourier Transform by transforming a sequence of N real numbers into an N-periodic sequence of complex numbers; and
    a controller configured to adjust at least one of charging or discharging of the EDS based on at least one of the voltage stability index or the voltage sensitivity factor to regulate and stabilize voltage of the EDS.

11. The system of claim 10, wherein the equivalent is a Thevenin equivalent.

12. The system of claim 10, wherein the voltage stability index is determined after detection of voltage instability in the EDS.

13. The system of claim 10, wherein the voltage sensitivity factor is determined after detection of a voltage violation in the EDS.

14. The system of claim 10, wherein the parameters for the equivalent continually change as EDS operating conditions vary.

15. The system of claim 10, wherein the parameters for the equivalent are identified using a Kalman filter.

16. The system of claim 10, wherein the parameters for the equivalent are identified using recursive least squares.

17. The system of claim 10, wherein the determining of the voltage stability index includes calculating a maximum power transferrable through a particular node.

18. A computer-readable storage medium including a computer-readable program, wherein the computer-readable program when executed on a computer causes the computer to perform the steps of:

measuring voltage and current at a node in an Energy Distribution System (EDS) where a Grid Energy Storage (GES) device is located;

generating a simplified equivalent of the EDS by identifying parameters for the equivalent and calculating phasors corresponding to the measured voltage and current, the phasors being calculated using Discrete Fourier Transform by transforming a sequence of N real numbers into an N-periodic sequence of complex numbers;

determining at least one of a voltage stability index or a voltage sensitivity factor of the EDS using the equivalent; and adjusting at least one of charging or discharging of the EDS based on at least one of the voltage stability index or the voltage sensitivity factor to regulate and stabilize voltage of the EDS.

* * * * *